(12) United States Patent
Shiflet (10) Patent No.: US 6,417,692 B2
(45) Date of Patent: *Jul. 9, 2002

(54) PROGRAMMABLE I/O CELLS WITH MULTIPLE DRIVERS

(75) Inventor: Eric M. Shiflet, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/777,393

(22) Filed: Feb. 5, 2001

Related U.S. Application Data (63) Continuation of application No. 09/137,917, filed on Aug. 20, 1998.
(60) Provisional application No. 60/056,741, filed on Aug. 20, 1997.

(51) Int. Cl.[7] .............................................. H01L 25/00
(52) U.S. Cl. .............................. 326/41; 326/37; 326/87
(58) Field of Search .............................. 326/39, 41, 87, 326/86

(56) References Cited

U.S. PATENT DOCUMENTS

| | | | |
|---|---|---|---|
| 4,472,647 A | * 9/1984 | Allgood et al. | 307/443 |
| 4,609,986 A | 9/1986 | Hartmann et al. | 364/20 C |
| 4,617,479 A | 10/1986 | Hartmann et al. | 307/465 |
| 4,677,318 A | 6/1987 | Veenstra | 307/465 |
| 4,713,792 A | 12/1987 | Hartmann et al. | 364/900 |
| 4,774,421 A | 9/1988 | Hartmann et al. | 307/465 |
| 4,837,460 A | 6/1989 | Uchida | 307/296.8 |

(List continued on next page.)

FOREIGN PATENT DOCUMENTS

| | | |
|---|---|---|
| WO | WO 96/37958 | 11/1996 |
| WO | WO 97/21273 | 6/1997 |

OTHER PUBLICATIONS

R. C. Minnick, "A Survey of Microcellular Research," Journal of the Association for Computing Machinery, vol. 14, No. 2, pp. 203–241, Apr. 1967.
S. E. Wahlstrom, "Programmable Logic Arrays—Cheaper by the Millions," Electronics, Dec. 11, 1967, pp. 90–95.
*Recent Developments in Switching Theory,* A. Mukhopadhyay, ed., Academic Press, New York, 1971, Chapters VI and IX, pp. 229–254 and 369–422.

*Primary Examiner*—Michael Tokar
*Assistant Examiner*—A. Tran
(74) *Attorney, Agent, or Firm*—Fish & Neave; Robert W. Morris

(57) ABSTRACT

A programmable input/output cell (I/O cell) for use with integrated circuits, and in particular programmable logic devices, is presented comprising input receiver circuitry, output driver circuitry and programmable elements. The input receiver and output driver circuitry each include multiple receivers/drivers that provide an interface between the signaling level of the integrated circuit and at least two other signaling standards. The programmable elements may be programmed to select a different signaling standard for each I/O cell to operate at, if desired. For instance, adjacent I/O cells may be connected to two different bus structures that utilize different signaling levels. The invention enables one I/O cell to translate between the PLD signaling level and the first bus signaling level, while the second I/O cell translates between the integrated circuit signaling level and the second bus signaling level.

35 Claims, 4 Drawing Sheets

U.S. PATENT DOCUMENTS

| | | | |
|---|---|---|---|
| 4,871,930 A | 10/1989 | Wong et al. | 307/465 |
| 4,899,067 A | 2/1990 | So et al. | 307/465 |
| 4,912,342 A | 3/1990 | Wong et al. | 307/465 |
| 5,121,006 A | 6/1992 | Pedersen | 307/465 |
| 5,220,214 A | 6/1993 | Pedersen | 307/465 |
| 5,222,044 A | 6/1993 | Tsujimoto | 365/226 |
| 5,260,610 A | 11/1993 | Pedersen et al. | 307/465 |
| 5,260,611 A | 11/1993 | Cliff et al. | 307/465 |
| 5,331,219 A | 7/1994 | Nakamura | 307/475 |
| 5,350,954 A | 9/1994 | Patel | 307/465 |
| 5,371,422 A | 12/1994 | Patel et al. | 326/41 |
| 5,394,034 A * | 2/1995 | Becker et al. | 326/39 |
| 5,508,653 A | 4/1996 | Chu et al. | 327/519 |
| 5,589,783 A | 12/1996 | McLure | 326/71 |
| 5,958,026 A | 9/1999 | Goetting et al. | 710/52 |
| 5,970,255 A | 10/1999 | Tran et al. | 710/73 |
| 6,239,612 B1 * | 5/2001 | Shiflet | 326/39 |

* cited by examiner

PROGRAMMABLE I/O CELLS WITH MULTIPLE DRIVERS

CROSS REFERENCE TO RELATED APPLICATIONS

This application is a continuation of U.S. patent application Ser. No. 09/137,917, filed Aug. 20, 1998, which claims the benefit of U.S. provisional patent application Ser. No. 60/056,741, filed Aug. 20, 1997.

BACKGROUND OF THE INVENTION

This invention relates to programmable logic devices ("PLDs"), and more particularly to input/output (I/O) circuitry that may be used to couple the PLDs to external circuitry having multiple signal interfaces.

Programmable logic devices are integrated circuits that are used to implement combinational and/or sequential digital functions that may be defined by a designer and programmed into the PLD. In this manner, PLDs may be configured by a user to implement, for example, any Boolean expression or registered function with built-in logic structures. Once configured, the user must connect the PLD to external circuitry that provides input signals to, and receives output signals from, the PLD. Often, integrated circuits are used to interface with several bus structures and/or control signals, each of which may utilize different signaling levels for communication.

One deficiency of conventional PLDs and their I/O circuitry is that each PLD must be configured to operate with specific external circuitry. For example, if a user utilizes Transistor-to-Transistor Logic (TTL) or Complementary Metal-Oxide Semiconductor (CMOS) external circuitry, the PLD must be configured to provide the appropriate drive signals. This often requires the use of translation circuitry. For example, Wong et al. U.S. Pat. No. 5,600,267 describes a CMOS circuit for translating a signal from Current-Mode-Logic (CML) to CMOS logic voltage levels. This deficiency is even more apparent in view of the programmable nature of PLDs and the flexibility provided to the end users. Another example of this requirement is described in Nhu U.S. Pat. No. 4,975,602, in which a multi-logic interface box is described that has a multi-connector coupler that provides different logic level conversions.

Further, the nature of PLDs, as semiconductor devices, is that they are susceptible to a wide range of potential hazards, such as electrostatic discharge (ESD). To avoid these potential problems, care must be taken in connecting the PLD pins to external circuitry. Any pins which are used as input pins should preferably be driven by an active source (including bi-directional pins during input operations). Additionally, unused pins are typically tied to ground to avoid the potential of additional DC current and noise being introduced into the circuits.

Output loading of the PLD I/O pins is typically resistive and/or capacitive. Resistive loading exists where the device output sinks or sources a current during steady-state operation (e.g., TTL inputs, terminated buses, and discrete bipolar transistors). Capacitive loading typically occurs from packaging and printed circuit board traces. Further, an important design consideration of the interface between the PLD and external circuitry is that the target device can supply both the current and speed necessary for the given loads.

One deficiency of Wong, Nhu and other known interface translators is the limited scope with which the circuitry may be used. Often these devices are designed such that either the interface only supports a single signaling type, or that external circuitry, such as Nhu's interface box, is required to act as a transceiver. More importantly, these devices often provide only a single interface on all of the input/output pins of the device at a single time.

In view of the foregoing, it would be desirable to be able to provide an I/O architecture that provides the capability to drive multiple logic standards.

It also would be desirable to be able to provide an I/O architecture having the capability to selectively drive different I/O cells on a single integrated circuit with different logic standards.

It further would be desirable to be able to provide an I/O architecture that may be programmed by a user to select any one of several logic standards for individual I/O cells of ah integrated circuit, such that a single PLD may be used with external circuitry that operates at different logic levels.

SUMMARY OF THE INVENTION

These and other objects are accomplished in accordance with the principles of the present invention by providing an I/O architecture that includes programmable I/O cells having multiple drivers, each of which provides an interface to a different signaling level. In a preferred embodiment of the present invention, PLDs are provided having programmable I/O cells that interface with, for example, High-Speed Transistor Logic (HSTL) (both terminated and non-terminated), Stub-Series Terminated Logic for 3.3 volts (SSTL_3), Gate Transistor Logic (GTL), TTL, CMOS, open drain and logic standards. Those skilled in the art will understand that other logic standards, both those presently available and others still to be developed, may be incorporated into the I/O cells such as those described herein without departing from the scope of the present invention.

The preferred embodiment of the present invention provides programmable I/O cells that each may be individually accessed at the same time the PLD programming file is downloaded into the PLD. Each I/O cell includes multiple drivers, only one of which is selected by the programming file. The other drivers are then disabled by in any conventional manner (such as tristating). The number of interfaces supported is only limited by the number of buffers placed in the silicon. A further advantage of the I/O cells of the present invention is that they may be configured such that a single programming bit may be used to set each cell, and all of the cells may be programmed at once via an ENABLE signal.

BRIEF DESCRIPTION OF THE DRAWINGS

The above and other objects and advantages of the invention will be apparent upon consideration of the following detailed description, taken in conjunction with the accompanying drawings, in which like reference numerals refer to like parts throughout, and in which.

DETAILED DESCRIPTION OF THE INVENTION

Figure 1:
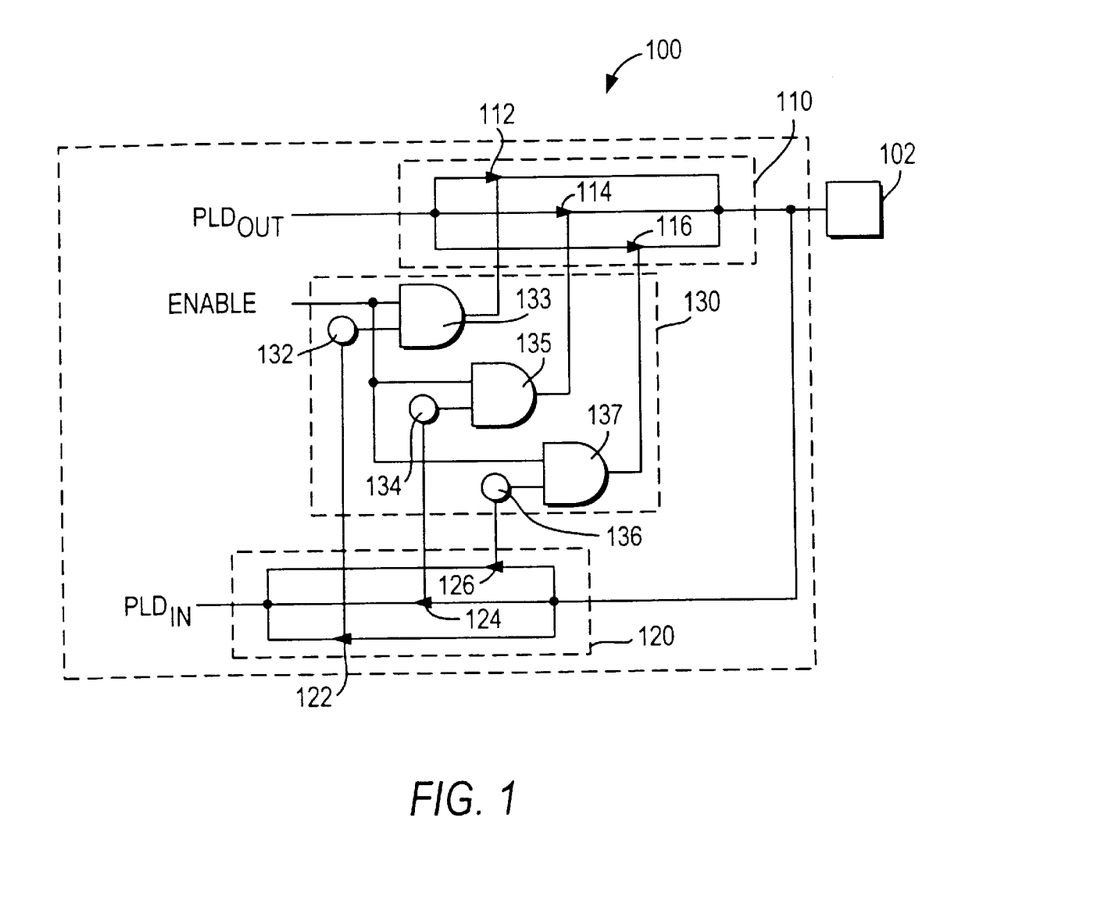
FIG. 1 is a schematic block diagram of an illustrative embodiment of an input/output cell having multiple drivers in accordance with the principles of the present invention.

FIG. 1 shows a schematic diagram of a programmable input/output cell 100 (I/O cell 100) that incorporates principles of the present invention. I/O cell 100, which is connected to input/output pad 102, includes output driver circuitry 110, input receiver circuitry 120 and programming circuitry 130. Input/output pad 102 is a conventional I/O pad that, for example, simply may be a pin on a connector. Output driver circuitry 110 receives output signals (i.e., $PLD_{OUT}$) from a programmable logic device (PLD) (not shown), and includes multiple I/O drivers 112, 114 and 116, that each correspond to a different signaling standard. While three drivers are shown, persons skilled in the art will appreciate that the advantages of the present invention may be obtained as long as two or more drivers are utilized in output driver circuitry 110. Each of drivers 112, 114 and 116 are connected in parallel between $PLD_{OUT}$ and I/O pad 102, and each includes a tri-state control line that is used to set the operational state of the driver.

Input receiver circuitry 120 provides input signals (i.e., $PLD_{IN}$) to a programmable logic device (PLD) (not shown), and includes multiple I/O receivers 122, 124 and 126, that each correspond to a different signaling standard. While three receivers are shown, persons skilled in the art will appreciate that the advantages of the present invention may be obtained as long as two or more receivers are utilized in input receiver circuitry 120. Each of receivers 122, 124 and 126 are connected in parallel between $PLD_{IN}$ and I/O pad 102, and each includes a tri-state control line that is used to set the operational state of the receiver.

Programming circuitry 130, which provides the control signals to output driver circuitry 110 and input receiver circuitry 120, includes multiple programming elements 132, 134 and 136. Programming elements 132, 134 and 136 each provide a logic signal to one of two-input AND gates 133, 135 and 137, respectively, while also enabling a selected one of receivers 122, 124 and 126, respectively. The other input of each AND gate is coupled to receive an ENABLE signal that, in combination with the signals from programming elements 132, 134 and 136, activates a selected, single output driver. Each of programming elements 132, 134 and 136 may be of any variety of memory cells. For example, programming elements 132, 134 and 136 may be SRAM (static random access memory), EPROM (erasable programmable read-only memory), EEPROM (electrically erasable programmable read-only memory), or antifuses.

For convenience, simplicity and to reduce chip area, it is preferable that elements 132, 134 and 136 be formed from the same variety of programmable elements as the PLD to which they are attached. Thus, if the PLD utilizes EEPROM elements (such as in the MAX 7000 family of PLDs available from Altera Corporation, San Jose, Calif.), each I/O cell 100 should also include EEPROM elements for programming elements 132, 134 and 136. Further, while such a configuration is preferable, it is not a requirement of the present invention (i.e., a PLD utilizing EEPROMs may be configured with I/O cells 100 utilizing SPAM elements).

The operation of I/O cell 100 depends on the status of programming elements 132, 134 and 136, only one of which should be set for a given I/O cell 100. The selected element is set in conjunction with the downloading of the programming file for the PLD, which, as previously described, sets the selected input receiver. The ENABLE signal, in conjunction with the corresponding AND gate, sets the appropriate output driver to determine the signaling level for each individual I/O pad 102. Thus, the signaling level of the output driver cannot be changed until an ENABLE signal is received.

In general, the logic output of a PLD (i.e., $PLD_{OUT}$) typically conforms to CMOS signaling level. Thus, output driver circuitry 110 and input receiver circuitry 120 will generally convert between CMOS signaling level and the selected signaling level. Persons skilled in the art will appreciate that the advantages of the present invention still may be obtained if the signaling level of the PLD is other than CMOS, such as, for example HSTL (High-Speed Transistor Logic). During PLD operation, only one set of driver/receivers (i.e., output driver and input receiver, such as output driver 112 and input receiver 122) is turned ON and the others are turned OFF via the tri-state control signal. The driver/receivers that are turned ON convert the incoming and outgoing signals from the selected signaling level to the signaling level of the PLD. As previously described, a further advantage of the present invention is, because individual I/O pads may be set to different standards, that even I/O pads next to each other may utilize different signaling standards if, for example, the pads are connected to two different bus structures.

The logic input of the PLD works in a manner similar to that of the logic output, except in reverse. The external input signal comes into the PLD through I/O pad 102 and is provided to input receivers 122, 124 and 126. Only one of programming elements 132, 134 and 136 is turned ON, and thus, only one of the input receivers is turned ON at any time. The one input receiver that is turned ON converts the input signals from the selected signaling level to the signaling level of the PLD, which generally is CMOS.

During bi-directional input/output operations, I/O cells 100 perform output functions as described above. Input operations also are as described above, except that when receiving input signals, it may be required to de-assert the ENABLE signal so that the input signal is not driven out during the input operation. If the signaling level is implemented using open-drain structures, however, the output ENABLE signal still may be used, but is not required.

Figure 2:
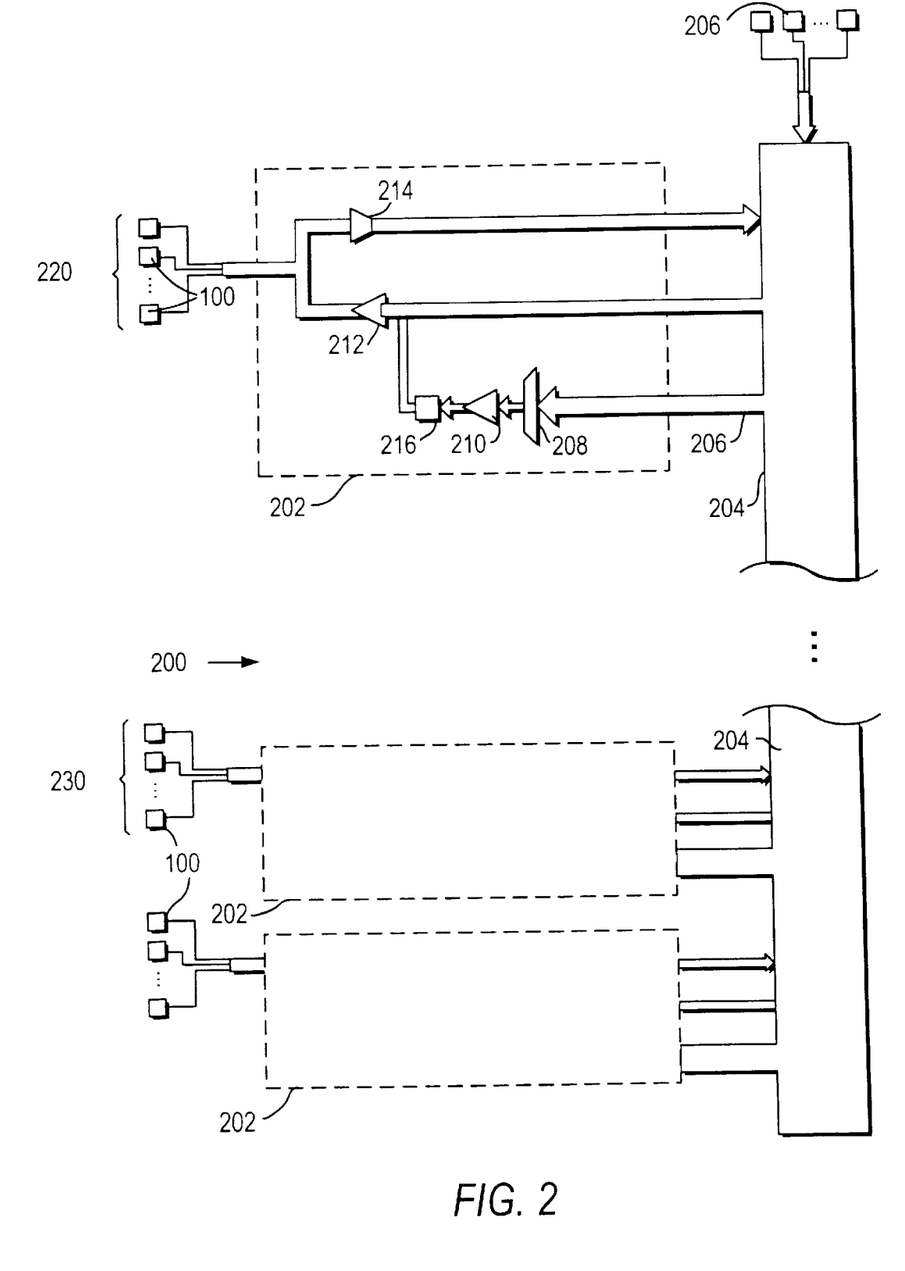
FIG. 2 is an overall simplified schematic block diagram of an illustrative example a programmable logic device (PLD) that incorporates the input/output cells of FIG. 1 in accordance with the principles of the present invention.

FIG. 2 is a simplified overall block diagram of an illustrative embodiment of a programmable logic device ("PLD") 200 constructed in accordance with the present invention. PLD 200 comprises: a plurality of programmable modules 202; a global interconnect array ("GIA") 204 for interconnecting modules 202; dedicated input pads 206 which can be used to direct input directly to GIA 204; and input/output pads 100 (that each include one I/O cell 100 and one I/O pad 102 as shown in FIG. 1). I/O cells 100 either can be used as input pads to send data indirectly through module 202 to GIA 204, or as output pads to transmit data from module 202.

Selected lines 206 connect, and are used to send data from, GIA 204 to modules 202. The methods for selecting and assigning lines 206 are well-known. For example, U.S. Pat. No. 5,384,499 describes the selecting and assigning of lines in a PLD in a specific pattern to maximize the user's ability to route a selected line to the output of a selected multiplexer. Module 202 comprises multiplexer 208, buffers 210, 212 and 214, logic array block ("LAB") 216. As previously described with respect to FIG. 1, signals may be provided to, or received from, PLD 200 via any number of signaling standards via I/O cells 100, which convert the input/output signals to the signaling standard of the PLD based upon which one of programming elements 132, 134 and 136 are selected. Moreover, the techniques of the present invention may further be utilized if, for example, the I/O pads generally indicated by reference numeral 220 are connected via one signaling standard while those indicated generally by reference numeral 230 are connected via a second signaling standard (or even if individual I/O pads with a single group need different signaling standards).

Figure 3:
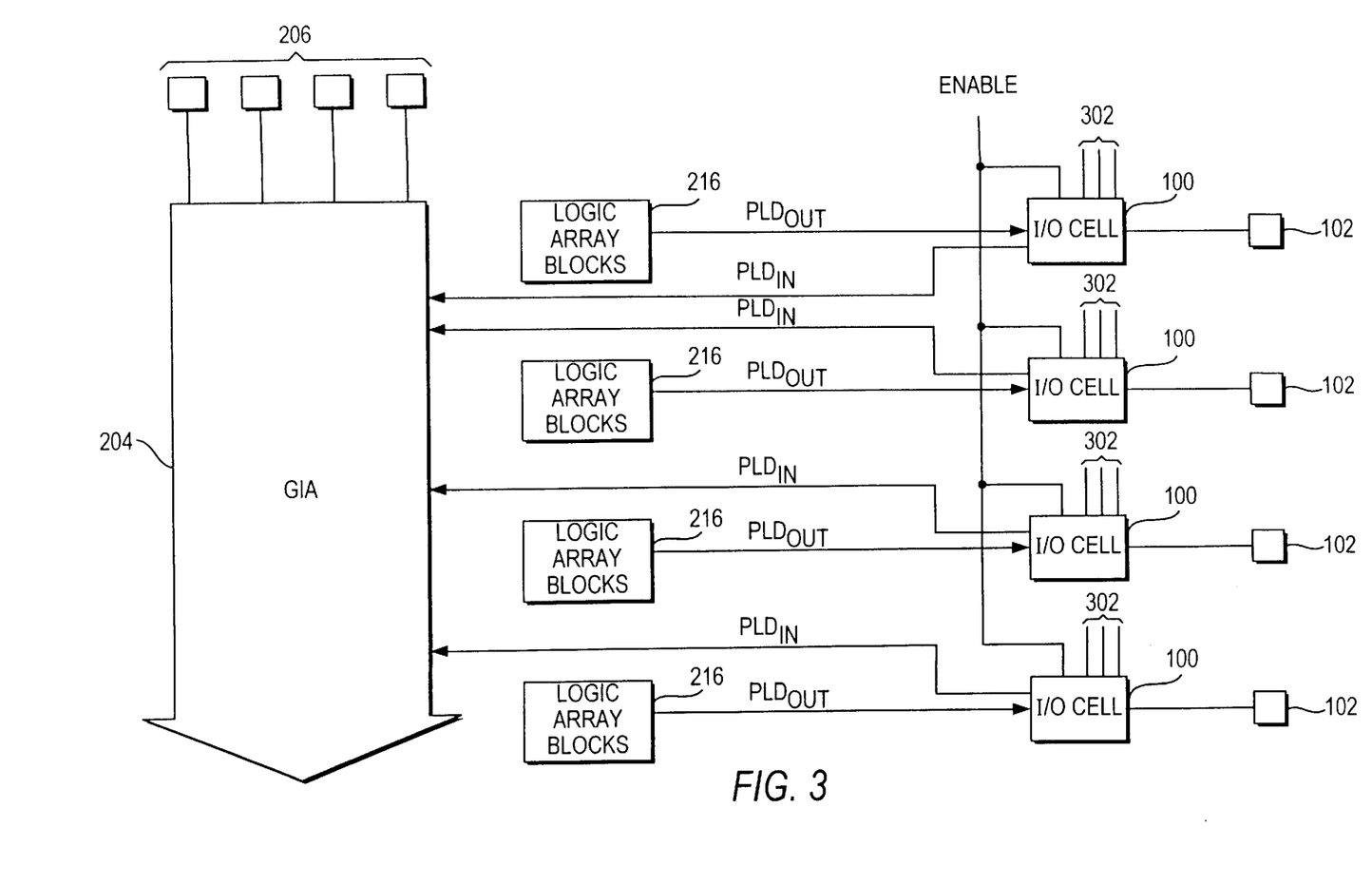
FIG. 3 is a simplified schematic block diagram of the programmable logic device of FIG. 2 that shows details of the interconnection of input/output cells of FIG. 1, in accordance with the present invention.

FIG. 3 shows a simplified schematic block diagram of a more detailed view of the I/O architecture of PLD 200 of FIG. 2 utilizing I/O cells 100 of FIG. 1. Preferably, PLD 200 includes a large number of I/O pads 102 and dedicated input pads 206 to support I/O intensive applications. For example, one preferred embodiment has 160 I/O pads 102 and four dedicated input pads 206 in a 208-pin package. Each of I/O pads 102 has a corresponding I/O cell 100 that provides translation between the signaling standard of PLD 200 and the selected signaling standard of the external device connected to each I/O pad 102. Preferably four dedicated inputs 206 provide inputs to GIA 204, or, for example, one dedicated input 206 can be used as a global clock signal, another as a global clear signal, while one of the remaining two dedicated inputs 206 can be used as an output enable signal (which would then be connected to the ENABLE line).

Programmable lines 302 provide a pathway for the programming signals to be applied to each of programming elements 132, 134 and 136 in each of I/O cells 100. Of course, persons skilled in the art will appreciate that additional programming lines may be added if more than three external signal standards are needed, or one of the lines may be eliminated if only two standards are utilized without departing from the spirit of the present invention. Also, as previously described, each of the drivers in circuitry 110 and receivers in circuitry 120 can operate in tri-state mode so that pads 102 can be configured as inputs or outputs. When pads 102 are configured as outputs, logic levels on the ENABLE line, switch the appropriate drivers of I/O cell 100 into a low output impedance mode in which the outputs of LABs 216 are routed to I/O pads 102. When I/O pads 102 are configured as inputs, the appropriate tri-state receivers (of receiving circuitry 120) are switched to a high output impedance mode, while the ENABLE signal is de-asserted so that external signals appearing on pads 102 are routed into GIA 204.

Figure 4:
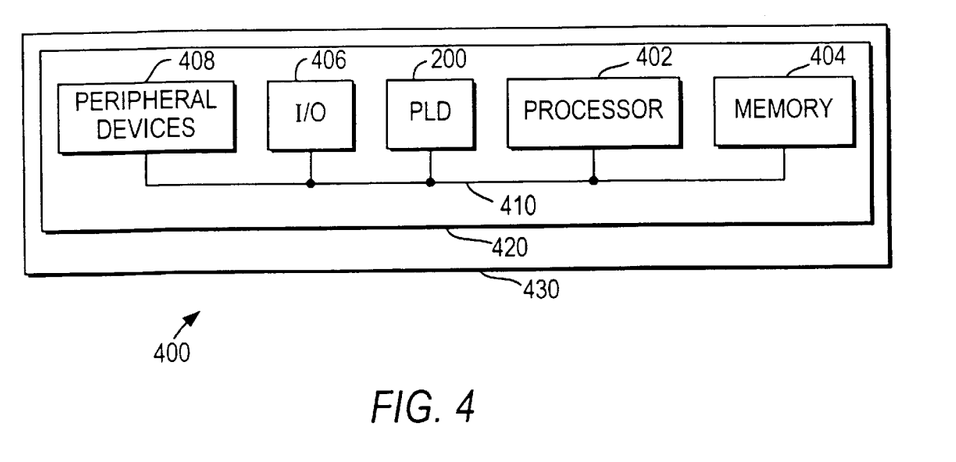
FIG. 4 is a simplified block diagram of an illustrative system employing a programmable logic device having the input/output cells of FIG. 1 in accordance with the present invention.

FIG. 4 illustrates the use of programmable logic device 200 and I/O cells 100 of this invention in a data processing system 400. Data processing system 400 may include one or more of the following components: processor 402; memory 404; I/O circuitry 406; and peripheral devices 408. These components are coupled together by a system bus 410 and are populated on a circuit board 420 which is contained in an end-user system 430. Bus 410 may be or include, for example, a PCI bus and the appropriate signaling level or bus 410 may employ any other type of signaling level provided that drivers and receivers within I/O cells 100 in PLD 200 are included to translate between the PLD signaling level and the selected signaling level.

System 400 can be used in a wide variety of applications, such as computer networking, data networking, instrumentation, video processing, digital signal processing, or any other application where the advantage of using reprogrammable logic is desirable. Programmable logic device 200 can be used to perform a variety of different logic functions. For example, programmable logic device 200 can be configured as a processor or controller that works in cooperation with processor 402. Programmable logic device 200 may also be used as an arbiter for arbitrating access to a shared resource in system 400. In yet another example, programmable logic device 200 can be configured as an interface between processor 402 and one of the other components in system 400. Moreover, it should be noted that system 400 is only exemplary, and that the true scope and spirit of the invention should be indicated by the claims below.

Thus, programmable I/O cells having multiple driver/receivers for use in interfacing with any one of several different signaling levels are provided. In particular, PLDs having I/O cells that may be connected to several different interface standards are provided. One skilled in the art will appreciate that the present invention can be practiced by other than the described embodiment, which is presented for purposes of illustration and not of limitation. Thus, the present invention is limited only by the claims which follow.

What is claimed is:

1. An input/output cell comprising:

an input/output pad;

input receiver circuitry comprising a plurality of input receivers coupled in parallel between the input/output pad and an integrated circuit input line having a signaling level, each of the input receivers translating input signals from one signaling level to the signaling level of the integrated circuit;

output driver circuitry comprising a plurality of output drivers coupled between the input/output pad and an integrated circuit output line, each of the output drivers translating input signals from one signaling level to the signaling level of the integrated circuit; and a plurality of control elements coupled to the input receiver circuitry and the output driver circuitry, each control element being able to receive at least one control signal specific to that control element, the control elements operating based on the at least one control signal to select one driver from the plurality of output drivers and to select one receiver from the plurality of input receivers.

2. The input/output cell of claim 1, wherein the input/output cell is programmable and the integrated circuit is a programmable logic device (PLD).

3. The input/output cell of claim 1 further comprising:

an ENABLE input line coupled to the plurality of control elements, the control elements operating to select the one driver from the plurality of output drivers only when an ENABLE signal is present on the ENABLE input line.

4. The input/output cell of claim 3, wherein the logic gate is an AND gate.

5. The input/output cell of claim 1, wherein the selected drivers and receivers translate between the signaling level of the integrated circuit and HSTL signaling level.

6. The input/output cell of claim 1, wherein the selected drivers and receivers translate between the signaling level of the integrated circuit and SSTL_3 signaling level.

7. The input/output cell of claim 1, wherein the selected drivers and receivers translate between the signaling level of the integrated circuit and GTL signaling level.

8. The input/output cell of claim 1, wherein all non-selected drivers and receivers are disabled.

9. The input/output cell of claim 1, wherein all the non-selected drivers receivers are tri-stated.

10. An input cell comprising:

an input/output pad;

input receiver circuitry comprising a plurality of input receivers coupled between the input/output pad and an integrated circuit input line having a signaling level, each of the input receivers translating input signals from one signaling level to the signaling level of the integrated circuit; and a plurality of control elements coupled to the input receiver circuitry, the control elements operating based on at least one control signal to select one receiver from the plurality of input receivers, each control element being able to receive the at least one control signal, the at least one control signal being specific to that control element, the at least one control signal not being required to be the inverse of any other control signal.

11. The input cell of claim 10, wherein the integrated circuit is a programmable logic device.

12. An output cell comprising:

an input/output pad;

output driver circuitry comprising a plurality of output drivers coupled between the input/output pad and an integrated circuit output line, each of the output drivers translating input signals from one signaling level to the signaling level of the integrated circuit; and a plurality of control elements coupled to the output driver circuitry, the control elements operating based on at least one control signal to select one driver from the plurality of output drivers, each control element being able to receive a control signal specific to that control element, the at least one control signal not being required to be the inverse of any other control signal.

13. The output cell of claim 12 further comprising:

an ENABLE input line coupled to a plurality of programming elements, the programming elements operating to select the one driver only when an ENABLE signal is present on the ENABLE input line.

14. The output cell of claim 12, wherein the integrated circuit is a programmable logic device.

15. An input/output cell comprising:

an input/output pad;

input receiver circuitry comprising a plurality of input receivers coupled between the input/output pad and an integrated circuit input line having a signaling level, each of the input receivers translating input signals from one signaling level to the signaling level of the integrated circuit;

output driver circuitry comprising a plurality of output drivers coupled in parallel between the input/output pad and an integrated circuit output line, each of the output drivers translating input signals from one signaling level to the signaling level of the integrated circuit, wherein the signaling level of the integrated circuit is implemented with an open-drain structure; and a plurality of control elements coupled to the input receiver circuitry and the output driver circuitry, the control elements operating to select one driver from the plurality of output drivers and to select one receiver from the plurality of input receivers each control element being able to receive at least one control signal that is specific to that control element.

16. The input/output cell of claim 15, wherein the integrated circuit is a programmable logic device.

17. A digital processing system comprising:

processing circuitry;

memory circuitry coupled to the processing circuitry; and an input/output cell as defined in claim 1 coupled to the processing circuitry and the memory circuitry.

18. A printed circuit board on which is mounted an input/output cell as defined in claim 1.

19. The printed circuit board of claim 18 further comprising:

memory circuitry mounted on the printed circuit board and coupled to the input/output cell.

20. The printed circuit board of claim 18 further comprising:

processing circuitry mounted on the printed circuit board and coupled to the input/output cell.

21. A method of translating signals between a signaling level selected from a plurality of signaling levels and a signaling level of an integrated circuit, the integrated circuit having a plurality of input/output cells each of which is coupled to an input/output pad, the input/output cells comprising a plurality of output drivers, a plurality of input receivers and a plurality of control elements, each control element being able to receive a control signal specific to that control element, the method comprising:

selecting a signaling level;

selecting a control element based on the currently selected signaling level; and sending the specific control signal to the selected control element.

22. The method of claim 21 further comprising:

asserting an ENABLE signal on a line coupled to the programming circuitry when the given input/output cell is operated in OUTPUT mode; and de-asserting the ENABLE signal when the given input/output cell is operated in INPUT mode.

23. The method of claim 21, further comprising:

dynamically changing the specific control signal.

24. The method of claim 23, wherein the dynamic change comprises:

sending a DISENGAGE signal to at least one control element.

25. The method of claim 23, wherein the dynamic change comprises:

sending an ENGAGE signal to at least one control element.

26. The method of claim 22, wherein the plurality of output drivers are tristate drivers and programming further comprises:

combining the ENABLE signal with at least one of the control signals in a logic circuit, the logic circuit providing a signal that actives the selected tristate driver.

27. The method of claim 26, wherein all non-selected tristate drivers are tristated.

28. A programmable logic device (PLD) that operates with a given signaling level comprising:

a plurality of interconnected programmable modules, each module being coupled to a plurality of input/output cells each of which is coupled to an input/output pad, the input/output cells comprising a plurality of output drivers, a plurality of input receivers and a plurality of control elements, each control element being able to receive a control signal specific to that control element, the control elements operating based on the specific control signal to select a driver and a receiver that translate between a selected signaling level and the given signaling level; and an interconnect structure for interconnecting the programmable modules.

29. The PLD of claim 28, wherein the selected driver is one driver of the plurality of output drivers and the control element is coupled to an ENABLE signal that must be asserted to activate the selected driver.

30. The PLD of claim 28, wherein all of the drivers and receivers are tristate devices and the non-selected drivers and receivers are tristated.

31. A digital processing system comprising:

processing circuitry;

memory circuitry coupled to the processing circuitry; and a PLD as defined in claim 28 coupled to the processing circuitry and the memory circuitry.

32. A printed circuit board on which is mounted a PLD as defined in claim 27.

33. The printed circuit board of claim 32 further comprising:

memory circuitry mounted on the printed circuit board and coupled to the PLD.

34. The printed circuit board of claim 32 further comprising:

processing circuitry mounted on the printed circuit board and coupled to the PLD.

35. A variable interface circuit comprising:

first, second, and third programming elements;

first, second, and third two-input AND gates, the first input of the first, second, and third AND gates being connected together, the second input of the first AND gate being connected to the first programming element, the second input of the second AND gate being connected to the second programming element, the second input of the third AND gate being connected to the third programming element;

first, second, and third input/output drivers, the first, second, and third drivers each having an input connection, an output connection, and a tri-state control line, the input connections of the first, second, and third drivers being connected together, the output connections of the first, second, and third drivers being connected together, the tri-state control line of the first driver being connected to the output of the first AND gate, the tri-state control line of the second driver being connected to the output of the second AND gate, the tri-state control line of the third driver being connected to the output of the third AND gate; and first, second, and third input/output receivers, the first, second, and third receivers each having an input connection, an output connection, and a tri-state control line, the input connections of the first, second, and third receivers being connected together, the output connections of the first, second, and third receivers being connected together, the tri-state control line of the first receiver being connected to the first programming element, the tri-state control line of the second receiver being connected to the second programming element, the tri-state control line of the third receiver being connected to the third programming element.

* * * * *